(12) United States Patent
Schulz et al.

(10) Patent No.: US 7,362,100 B2
(45) Date of Patent: Apr. 22, 2008

(54) PARALLEL MR IMAGING METHOD

(75) Inventors: Volkmar Schulz, Aachen (DE); Peter Mazurkewitz, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/595,740

(22) PCT Filed: Nov. 2, 2004

(86) PCT No.: PCT/IB2004/052265

§ 371 (c)(1),
(2), (4) Date: May 8, 2006

(87) PCT Pub. No.: WO2005/047914

PCT Pub. Date: May 26, 2005

(65) Prior Publication Data

US 2007/0069727 A1    Mar. 29, 2007

(30) Foreign Application Priority Data

Nov. 12, 2003   (EP)   ................................. 03104161

(51) Int. Cl.
*G01V 3/00* (2006.01)
(52) U.S. Cl. ...................... 324/309; 324/322
(58) Field of Classification Search ................ 324/322, 324/318, 309
See application file for complete search history.

(56) References Cited

U.S. PATENT DOCUMENTS

| 4,851,777 | A | * | 7/1989 | Macovski | .................... 324/309 |
|---|---|---|---|---|---|
| 5,471,142 | A | | 11/1995 | Wang | |
| 5,592,088 | A | | 1/1997 | Matsunaga et al. | |
| 5,633,585 | A | | 5/1997 | Kuhn | |
| 5,759,152 | A | | 6/1998 | Felmlee et al. | |
| 5,861,749 | A | | 1/1999 | Van Heelsbergen | |
| 6,870,368 | B2 | * | 3/2005 | Visser et al. | ................. 324/318 |
| 7,026,818 | B2 | * | 4/2006 | Machida et al. | ............ 324/322 |
| 2003/0038632 | A1 | | 2/2003 | Duensing et al. | |
| 2003/0132750 | A1 | | 7/2003 | Machida et al. | |
| 2004/0135579 | A1 | | 7/2004 | Takizawa et al. | |

FOREIGN PATENT DOCUMENTS

WO    WO 95/04947 A1    2/1995

OTHER PUBLICATIONS

De Zwart, J.A., et al.; Design of a SENSE-Optimized High-Sensitivity MRI Receive Coil for Brain Imaging; 2002; MRM; 47:1218-1227.

(Continued)

*Primary Examiner*—Louis M Arana

(57) ABSTRACT

As disclosed herein, in a parallel magnetic resonance imaging method core magnetization is excited in an examination volume of a magnetic resonance (MR) device by generating at least one high frequency (HF) pulse. Two or more MR signals are recorded in parallel from the examination volume via two or more receiving channels (R, S) of the MR device using an HF coil arrangement (9), which comprises a number of coil elements (15, 16) which is greater than the number of receiving channels (R, S), wherein the respective MR signal on each receiving channel (R, S) is formed by weighted superimposition of coil signals (A, B, C, D, B) of the individual coil elements (15, 16). An MR image is reconstructed from the recorded MR signals, the MR signals being combined with one another taking into account effective spatial sensitivity profiles associated with the individual receiving channels (R, S).

10 Claims, 2 Drawing Sheets

OTHER PUBLICATIONS

Lazovic-Stojkovic, J., et al.; Hexagonal Zero Mode Coil: A Single Channel Multi-Coil Design for Small Animal Magnetic Resonance Imaging; 2002; IEEE; pp. 65.

Lin, F., et al.; Quantitative Spectral/Spatial Analysis of Phased Array Coil in Magnetic Resonance Imaging Based on Method of Moment; 1999; IEEE Trans. on Medical Imaging; 18(12)1129-1137.

Pruessmann, K.P., et al.; SENSE: Sensitivity Encoding for Fast MRI; 1999; MRM; 42:952-962.

Sodickson, D.K., et al.; Recent advances in image reconstruction, coil sensitivity calibration, and coil array design for SMASH and generalized parallel MRI; 2002; MRM; 13:158-163.

Walsh, D.O., et al.; Adaptive Reconstruction of Phased Array MR Imagery; 2000; MRM; 43:682-690.

* cited by examiner

PARALLEL MR IMAGING METHOD

The invention relates to a parallel magnetic resonance imaging method, in which two or more MR signals are recorded in parallel and combined with one another to reconstruct an MR image taking into account spatial sensitivity profiles of coil elements of an HF coil arrangement used to record the MR signals.

The invention also relates to an MR device for carrying out a method of this type and a computer program for implementing a method of this type on an MR device.

In MR imaging, the localization of core magnetization generally takes place within the examination volume of an MR device by means of spatially inhomogeneous magnetic fields (magnetic field gradients) which can be changed with respect to time. The MR signals used for the image reconstruction are recorded as voltage which is induced in an HF coil arrangement surrounding the examination volume, under the influence of a suitable sequence of magnetic field gradients and high frequency pulses in the time domain. The actual image reconstruction then takes place, for example, by a Fourier transformation of the time signals. The input of the sequence of magnetic field gradient and high frequency pulses determines the scanning of the spatial frequency space (so-called "k-space"), by which, in turn, the volume area to be depicted (the field of view, or for short FOV) and the image resolution are established. The number of phase coding steps in scanning the spatial frequency space and therefore the duration of the imaging sequence is predetermined by demands on the FOV and on the image resolution. This directly produces a substantial problem of MR imaging: the recording of an image of the complete FOV in the desired resolution often takes up an undesirably long time. This applies, in particular, when not only two-dimensional MR images, but also three- or more dimensional images, for example with additional spectral dimensions are to be recorded.

A large number of technical developments in the area of MR imaging, aim to shorten the image recording time. Developments in terms of apparatus which allow switching of the magnetic field gradients as quickly as possible, have reached the limits of what is technically feasible nowadays and in particular the limits of what can be required physiologically of the patient. However, the recording times are still too long for a large number of applications.

There appears to be a prospect of overcoming said technical and physiological limits of conventional MR imaging owing to the parallel methods which have recently become known, such as, for example, the so-called SENSE method ("sensitivity encoding") (cf. PRUESSMANN et al.: "SENSE: Sensitivity Encoding for Fast MRI" in Magnetic Resonance in Medicine, Vol. 42, Page 952, 1999). This previously known method is based on the knowledge that the spatial sensitivity profile of the HF coil arrangement used imposes spatial information on the MR signals which can be used in the image reconstruction. In parallel, i.e. simultaneous use of a plurality of separate coil elements for recording the MR signals with different spatial sensitivity profiles in each case, the recording time for an image can be reduced compared to the conventional methods by a factor which in favorable cases is equal to the number of coil elements used, owing to a combination of the MR signals recorded with incomplete scanning of the spatial frequency space.

As in SENSE imaging the spatial sensitivity profiles of the coil elements of the HF coil arrangement used are regarded as particularly significant, the image reconstruction from the MR signals recorded in parallel, with incomplete scanning of the spatial frequency space, cannot take place exclusively by means of Fourier transformation as is usual in conventional MR imaging methods. Rather, special signal processing techniques are required for image reconstruction in SENSE imaging.

The general theoretical basis of the SENSE method are described in detail in the article by Pruessmann et al quoted above. In the case of Cartesian scanning of the spatial frequency space, a conventional Fourier transformation is generally carried out initially for each MR signal, from which a number of sets of image data affected by aliasing corresponding to the number of coil elements used then results. In a second step, these intermediary sets of image data are then combined to form a final MR image, the precise knowledge of the spatial sensitivity profiles of the individual coil elements of the HF coil arrangements used being utilized in order to eliminate the aliasing. This second step is generally carried out by means of linear algebra, for which a so-called unfolding matrix is calculated, the matrix elements of which are determined by the spatial sensitivity profiles of the coil elements, on the one hand, and by the noise behavior (self noise and cross-correlated noise) of the coil elements, on the other hand.

The parallel use of a plurality of coil elements, in particular of surface coils, which are also known as so-called phased-array coils, to receive the MR signals from the examination volume is, for example, also known from WO 95/04947. According to this known method, a plurality of coil elements are also operated in parallel in order to combine the respectively detected MR signals to finally form an overall image. It is advantageous here that owing to the limited spatial sensitivity range of the individual coil elements a particularly low image noise is produced overall in the reconstructed MR image. The combination of a plurality of coil elements for imaging with image noise which is as low as possible is also known under the name SYNERGY. Unlike the above-mentioned SENSE method, SYNERGY, is less about the speed of image recording and is more concerned with optimizing the image quality.

It is known that, in parallel MR imaging methods, the minimum achievable image noise or, in other words, the maximum signal-to-noise ratio to be achieved is heavily dependent on the geometry, the spatial sensitivity profile and the noise behavior of the HF coil arrangement used. In particular, for effective parallel MR imaging, it is necessary for the spatial sensitivity profiles of the individual coil elements of the HF coil arrangement to differ to a sufficient degree from one another. It is a problem in the parallel MR imaging methods known from the prior art in this context that the HF coil arrangements which are used have coil elements with rigidly predetermined spatial sensitivity profiles in a rigid spatial arrangement. Depending on the application, a special arrangement of the coil elements has to be selected so that, for example, the body part of a patient to be examined can be optimally imaged. The optimization of the HF coil arrangements takes place here typically by means of experiment or by computer simulations. Overall, it is disadvantageous that the HF coil arrangements used in the known parallel MR imaging methods cannot be used very flexibly.

Proceeding from this prior art, the present invention is based on the object of providing a parallel MR imaging method, in which a universally usable HF coil arrangement is used. In the process, the method should be usable for MR imaging in accordance with both the SENSE and the SYNERGY method.

The invention achieves this object by a parallel MR imaging method, in which initially core magnetization in the examination volume of an MR device is excited by generating at least one HF pulse. According to the invention, two or more MR signals are then recorded in parallel from the examination volume via two or more receiving channels of the MR device, and, more precisely, using an HF coil arrangement comprising a number of coil elements which is greater than the number of receiving channels, the respective MR signal being formed on each receiving channel by weighted superimposition of coil signals of the individual coil elements. Finally, an MR image is reconstructed from the recorded MR signals, the MR signals being combined with one another according to the invention taking into account effective spatial sensitivity profiles associated with the individual receiving channels.

It is essential in the method according to the invention that in the process an HF coil arrangement is used, which consists of an optionally large number of individual coil elements in a rigidly predetermined geometric arrangement. The method according to the invention allows the coil signals of the individual coil elements to be distributed by weighted superimposition over the number of receiving channels which is low in comparison to the number of coil elements. The method according to the invention can be used very flexibly, as the respective effective spatial sensitivity profiles for the recorded MR signals can be predetermined more or less as desired for each conceivable application by suitable selection of the weighting factors, by which the weighted superimposition of the coil signals on the receiving channels is determined. The method according to the invention can therefore be optimally used for SENSE and also SYNERGY imaging, without any adaptation or change to the hardware of the MR device being necessary. It is also advantageous here, in particular that a conventional MR device with a comparatively low number of for example 2, 4 or 8 separate receiving channels can be used, over which the individual coil signals of the possibly considerably larger number of coil elements of the HF coil arrangement can be distributed by weighted-superimposition.

Furthermore, it is particularly advantageous that, in the method according to the invention, the weighting factors for the weighted superimposition of the coil signals on the individual receiving channels can be calculated such that the image noise in predeterminable image points or image areas of the reconstructed MR image is minimal. For this purpose, the knowledge of the theoretical basis of SENSE imaging according to the above-quoted article by Pruessmann et al is used, in order, for example, to calculate the individual weighting factors according to the spatial sensitivity profiles of the individual coil elements and their noise behavior. For this it is only necessary for the spatial sensitivity profiles of the individual coil elements of the HF coil arrangement used according to the invention and the self noise and the cross-correlated noise of the individual coil elements to be precisely determined once. Thereafter, the weighting factors can, as it were, be automatically calculated by pre-selection of image areas, in which a minimal image noise is desired such that optimal SENSE imaging with a maximum reduction factor, i.e. with a minimum image recording time, is ensured.

As already stated, effective spatial sensitivity profiles are in each case associated with the individual receiving channels in the parallel MR imaging method according to the invention. These effective spatial sensitivity profiles can advantageously be calculated with low expenditure from the precisely known spatial sensitivity profiles of the individual coil elements of the HF coil arrangement, and more precisely, according to the previously calculated weighting factors.

AN MR device according to an embodiment of the invention is suitable for carrying out the MR method according to the invention. The above-described method can be implemented on a device of this type by means of a suitable program controller of the control mechanism and/or the reconstruction and visualization mechanism.

The method according to the invention can be made available to the users of MR devices of this type in the form of a corresponding computer program. A computer program for optimizing the use according to the invention of an HF coil arrangement for parallel MR imaging consisting of a plurality of coil elements is the subject of alternate embodiments of the invention. Computer programs of this type can be stored on suitable data media, such as for example CD-ROM or diskette, or they can be downloaded via the Internet for example onto the control mechanism of an MR device.

The invention will be described in more detail hereinafter with the aid of the embodiments with reference to the Figures, in which.

Figure 1:
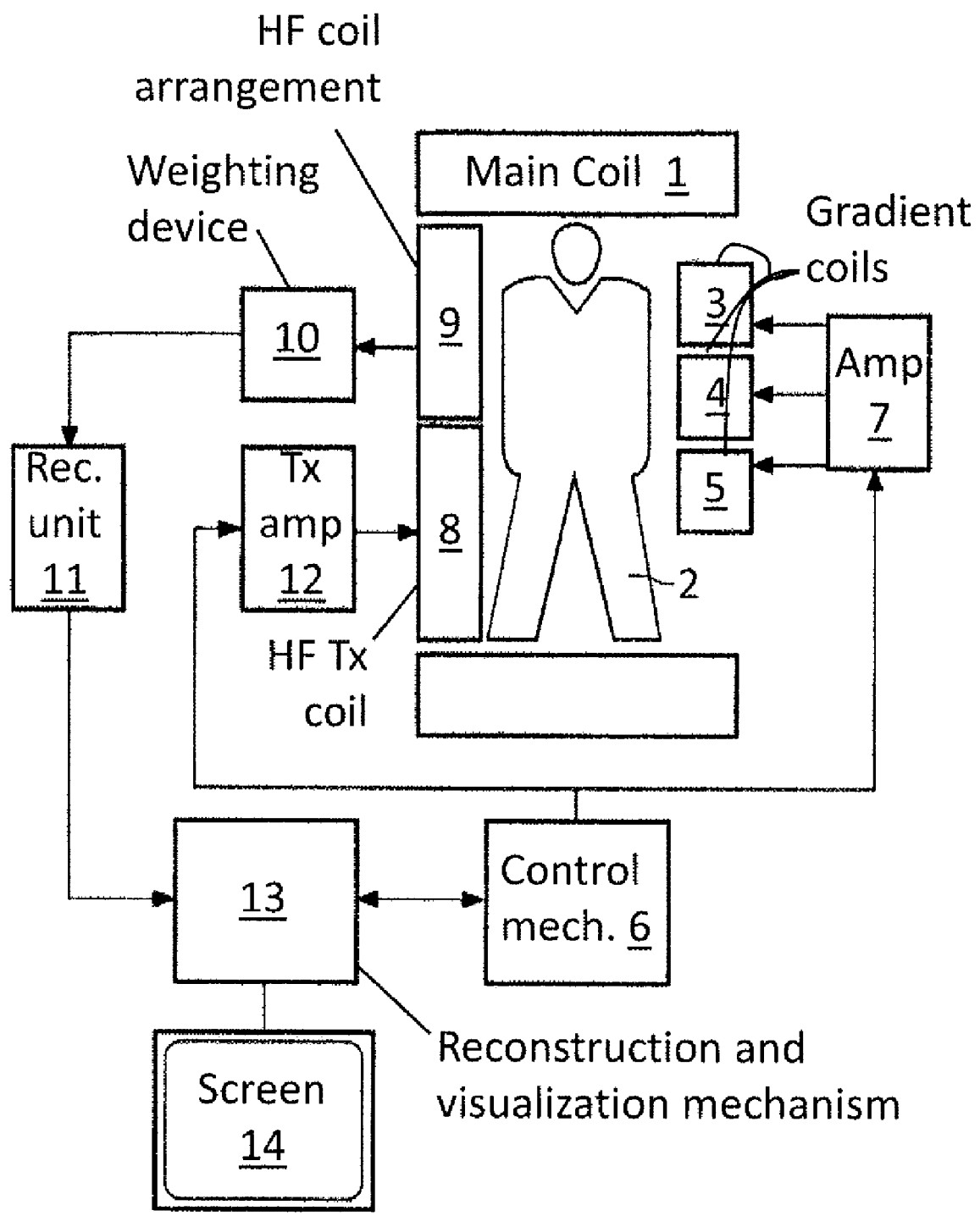
FIG. 1 shows an MR device according to the invention.

FIG. 1 shows an MR device according to the invention as a block diagram. The MR device consists of a main field coil 1 to generate a homogeneous, static magnetic field, in an examination volume in which a patient 2 is located. The MR device moreover has gradient coils 3, 4 and 5 to generate magnetic field gradients in different spatial directions within the examination volume. The course of the magnetic field gradients with respect to time and space is controlled within the examination volume by means of a control mechanism 6 which is connected via a gradient amplifier 7 to the gradient coils 3, 4 and 5. An HF transmitting coil 8 also belongs to the MR device shown to generate high frequency fields in the examination volume. An HF coil arrangement 9 consisting of a plurality of coil elements, not shown in detail in FIG. 1, is used to record MR signals from the examination volume. The coil elements of the HF coil arrangement 9 are connected via a weighting device 10 to a receiving unit 11 of the MR device which demodulates and amplifies the MR signals transmitted via a plurality of receiving channels from the weighting mechanism 10 to the receiving unit 11. The weighting mechanism 10 is controlled by the control mechanism 6, whereby the weighting factors for the weighted superimposition of the coil signals received by means of the individual coil elements of the HF coil arrangement 9 are determined on each receiving channel. Furthermore, the control mechanism 6 is connected to the transmitting coil 8 via a transmission amplifier 12. The MR signals which have been demodulated and amplified by means of the receiving unit 11 are fed to a reconstruction and visualization unit 13, by means of which an MR image is reconstructed from the recorded MR signals, wherein effective spatial sensitivity profiles associated with the individual receiving channels and which are produced from the weighting factors effective in the weighting mechanism 10, are taken into account. The reconstructed MR image can be shown by means of a screen 14. The control mechanism 6 and the reconstruction and visualization mechanism 13 have a suitable program control for carrying out the above-described MR imaging method according to the invention.

Figure 2:
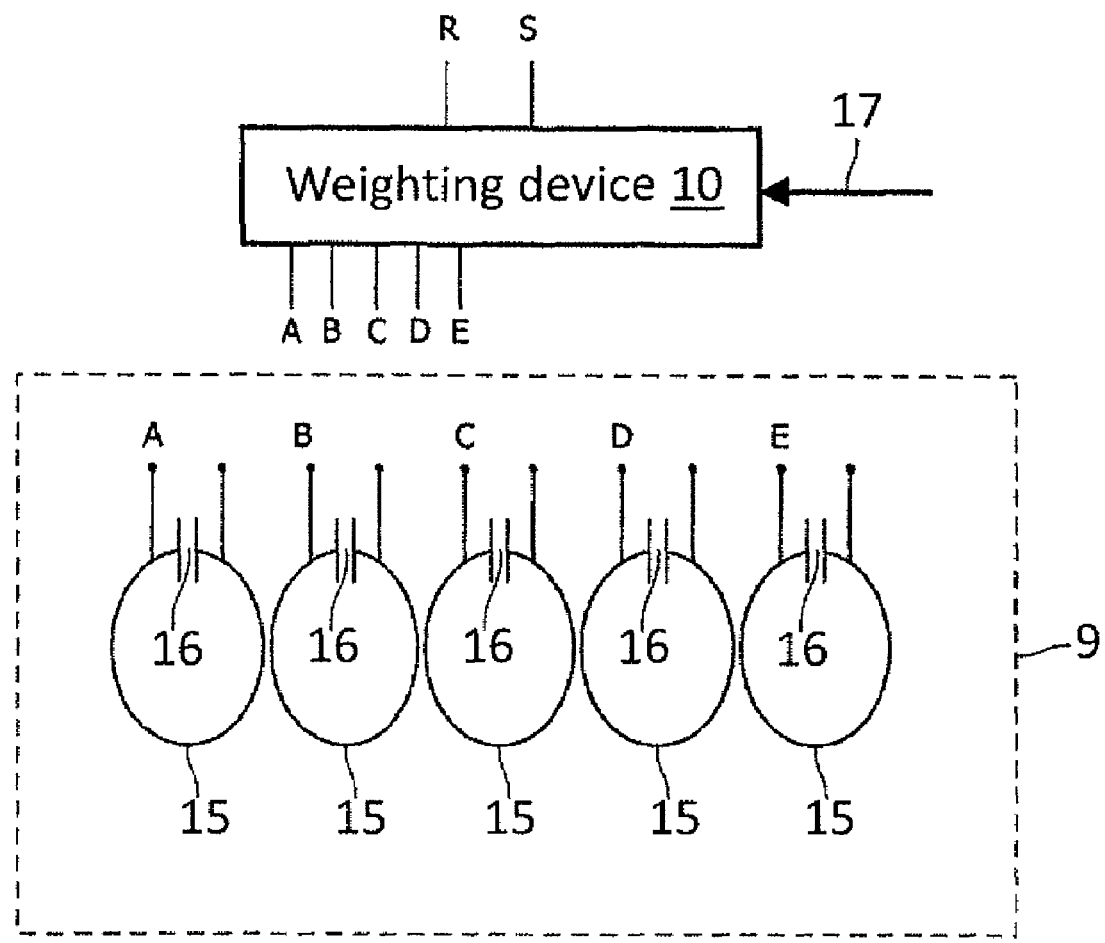
FIG. 2 shows the HF coil arrangement and weighting mechanism of the MR device according to the invention.

The HF coil arrangement 9 of the MR device according to the invention is shown in FIG. 2, this consisting of a plurality of individual coil elements. These are respectively composed of a conductor loop 15 and a capacitor 16. The coil signals of the individual coil elements are in each case at the outputs A, B, C, D and E of the HF coil arrangement 9. These coil signals are fed to corresponding inputs of the weighting mechanism 10 also shown in FIG. 2. The weighting mechanism is triggered by the control mechanism 6 of the MR device, as indicated by the arrow 17, to preselect the weighting factors. According to these weighting factors, weighted superimposition of the coil signals at the inputs A, B, C, D and E of the weighting mechanism 10 takes place by means of the weighting device 10 on two receiving channels R and S of the MR device. For this purpose, the weighting mechanism 10 may comprise, for example, digital signal processors or other suitable signal processing devices (for example FPGAs). The superimposed coil signals are fed via the receiving channels R and S, as separate MR signals, to the receiving unit 11 of the MR device for further processing.

According to the theoretical formalism described in the above-quoted article by Pruessmann et al, the spatial sensitivity profiles of the individual coil elements of the HF coil arrangement 9 are taken into account by a sensitivity matrix $\hat{S}$. The matrix elements of $\hat{S}$ in each case reflect the sensitivities of the individual coil elements at the positions of individual image points of the MR image to be reconstructed. The weighting factors for the weighted superimposition of the coil signals according to the invention can be combined in a weighting matrix W, wherein the matrix elements of W in each case reflect the weighting factors which are effective for the superimposition of the coil signals on the individual receiving channels R, S. The effective spatial sensitivity profiles associated with the receiving channels R, S can then be calculated as $S=W\hat{S}$. The matrix elements of a coil noise matrix $\hat{\psi}$ reflect the self noise and the cross-correlated noise of the individual coil elements of the HF coil arrangement. An optimum signal-to-noise ratio in the relevant image areas of the MR image to be reconstructed is produced when the weighting matrix is calculated as $W=\hat{S}^H\hat{\psi}^{-1}$. $\hat{S}^H$ is the hermetically adjoint matrix of $\hat{S}$ here, and $\hat{\psi}^{-1}$ is the inverse matrix to the coil noise matrix $\hat{\psi}$.

The invention claimed is:

1. A parallel magnetic resonance imaging method comprising:
   a) exciting core magnetization in the examination volume of an MR device by generating at least one HF pulse;
   b) parallel recording of two or more MR signals from the examination volume via two or more receiving channels of the MR device using an HF coil arrangement comprising a number of coil elements in a predetermined geometric arrangement, which is larger than the number of receiving channels, the respective MR signal on each receiving channel being formed by weighted superimposition of coil signals of the individual coil elements; and
   c) reconstructing an MR image from the recorded MR signals, the MR signals being combined with one another taking into account the effective spatial sensitivity profiles associated with the individual receiving channels.

2. A method as claimed in claim 1, wherein the weighting factors for the weighted superimposition of the coil signals on the individual receiving channels is calculated such that the image noise in predeterminable image points or image areas of the reconstructed MR image is minimal.

3. A method as claimed in claim 2, wherein the weighting factors are calculated according to the spatial sensitivity profiles of the individual coil elements and their noise behavior.

4. A method as claimed in claim 2, wherein the effective spatial sensitivity profile associated with each receiving channel is calculated from the spatial sensitivity profiles of the individual coil elements of the HF coil arrangement according to the weighting factors for the weighted superimposition of the coil signals on the respective receiving channel.

5. A magnetic resonance (MR) device comprising:
   a main field coil for generating a homogeneous, static magnetic field in an examination volume;
   a weighting mechanism;
   an HF coil arrangement including a plurality of coil elements, the coil elements being connected to two or more receiving channels via the weighting mechanism such that an MR signal is generated on each receiving channel comprises a weighted superimposition of coil signals received from the examination volume from the individual coil elements according to predeterminable weighting factors;
   a reconstruction and visualization mechanism for processing and displaying the MR signals; and
   a control mechanism for controlling the weighting mechanism and the reconstruction and a visualization mechanism, the control mechanism implementing a method according to claim 1 using the MR device.

6. A magnetic resonance device as claimed in claim 5, the number of coil elements of the HF coil arrangement being greater than the number of receiving channels.

7. A magnetic resonance device as claimed in claim 5, the weighting device comprising signal processors.

8. A magnetic resonance device as claimed in claim 5, wherein the control mechanism is integral with the reconstruction and visualization mechanism of the MR device.

9. A computer readable medium comprising a computer program of instructions executable b a machine to perform a method of optimizing the use of an HF coil arrangement including a plurality of coil elements for parallel MR imaging, wherein the computer program calculates weighting factors for the formation of two or more MR signals by weighted superimposition of coil signals of the individual coil elements in such a way that the image noise in predeterminable image points or image areas of an MR image reconstructed from the MR signals is minimal.

10. A computer readable medium as claimed in claim 9, wherein the weighting factors are calculated according to the spatial sensitivity profiles of the individual coil elements and their noise behavior.

* * * * *